United States Patent [19]

Dallavalle et al.

[11] Patent Number: 5,763,907
[45] Date of Patent: Jun. 9, 1998

[54] LIBRARY OF STANDARD CELLS FOR THE DESIGN OF INTEGRATED CIRCUITS

[75] Inventors: Carlo Dallavalle, Vimercate - Milano; Pierangelo Confalonieri, Canonica D'adda -Bergamo, both of Italy

[73] Assignee: SGS-Thomson Microelectronics, S.r.l., Agrate Brianza, Italy

[21] Appl. No.: 763,937

[22] Filed: Dec. 12, 1996

[30] Foreign Application Priority Data

Dec. 29, 1995 [EP] European Pat. Off. ............. 95830559

[51] Int. Cl.⁶ .................................................. H01L 27/10
[52] U.S. Cl. ........................ 257/202; 257/206; 257/207; 257/208; 257/211
[58] Field of Search .................................. 257/202, 206, 257/207, 208, 211

[56] References Cited

U.S. PATENT DOCUMENTS

| | | | |
|---|---|---|---|
| 3,983,619 | 10/1976 | Kubo et al. | 257/208 |
| 5,083,178 | 1/1992 | Otsu | 257/208 |
| 5,164,811 | 11/1992 | Tamura | 257/206 |
| 5,367,187 | 11/1994 | Yuen | 257/202 |
| 5,493,135 | 2/1996 | Yin | 257/202 |
| 5,534,724 | 7/1996 | Nagamine | 257/202 |
| 5,612,553 | 3/1997 | Arakawa | 257/206 |
| 5,619,062 | 4/1997 | Janai et al. | 257/202 |
| 5,635,737 | 6/1997 | Yin | 257/206 |

FOREIGN PATENT DOCUMENTS

| | | |
|---|---|---|
| 0348933 A3 | 6/1989 | European Pat. Off. |
| 0638936 A1 | 8/1994 | European Pat. Off. |
| 63-0316440 | 12/1988 | Japan |

*Primary Examiner*—Valencia Martin Wallace
*Attorney, Agent, or Firm*—Allen, Dyer, Doppelt, Milbrath & Gilchrist, P.A.

[57] ABSTRACT

A cell library for the design of integrated circuits, for example using CMOS technology, includes cells which define circuit modules in rectangular areas having an identical side. Two traces are provided which extend at right-angles to the identical side and which define strips for connection to the supply, at least one of which is in contact with the source regions of MOS transistors of a CMOS pair. In order to permit the design of integrated circuits in which the analog parts are insensitive to the noise induced in the substrate by the digital parts and in which it is possible to reduce the current absorption of the digital parts in stand-by mode, the cell library also provides a group of cells in which there is provided at least one additional trace which defines an additional strip for connection to the outside and which is in contact with the body regions of the MOS transistors of the CMOS pair.

13 Claims, 2 Drawing Sheets

LIBRARY OF STANDARD CELLS FOR THE DESIGN OF INTEGRATED CIRCUITS

FIELD OF THE INVENTION

The present invention relates to a library of standard cells for the design of integrated circuits.

BACKGROUND OF THE INVENTION

As is known, a monolithic integrated circuit is a substantially planar structure formed by active and passive electronic components which are formed on a substrate of semi-conductive material, such as monocrystalline silicon in the majority of cases. The components are typically formed by modifying locally, by means of known techniques of masking and doping, the electroconductive properties of the semiconductor and by forming, on the substrate, layers of insulating material and electroconductive strips which are used to connect the circuit components to one another. The arrangement of the components on the substrate and the orientation of the interconnecting strips, defined in the design phase to effect the desired circuit functions, constitute the topography, or "layout", of the integrated circuit.

In the manufacture of integrated circuits having a very high integration density, it is known to use modules, or elemental circuit structures, which are predisposed each to develop a predetermined function. These modules may be formed by relatively simple circuits, such as inverters and logic gates, or by more complex circuits, such as the various types of bistable circuits, which are combined and connected to one another in order to obtain a circuit assembly having the desired characteristics.

The positioning and interconnecting operations are typically carried out with the aid of computer-assisted design instruments, such as the so-called "Place and Route" CAD systems. In these systems, the layouts of the functional modules are defined by standard cells, that is to say, by all of the data describing the geometric configurations of the masks which give rise to the various circuit modules. The group formed by the standard cells available for designing an integrated circuit in accordance with a given manufacturing technology is normally called a library of standard cells.

All of the cells of a library have some geometric characteristics in common which permit a simple reciprocal coupling of the circuit modules which they define and as little waste of space as possible. For example, the cells define modules which occupy a substantially quadrangular area of which one side is the same for all of the modules and the other side has a variable length as a function of the circuit complexity of the module. In addition, each cell comprises at least two traces, for supplying the corresponding circuit module, and which extend substantially at right-angles to the non-variable side at the same distance from the base of the module. These traces define on the module rectilinear strips of electroconductive material (metal) which electrically connect the source regions of some of the MOS type transistors having the same type of conductivity, that is to say, having n-channels or p-channels, of the module to one another and to those of the adjacent modules, and also to the supply terminals of the integrated circuit.

In conventional integrated circuits, the body regions of the MOS transistors, that is to say the regions in which are formed the source and drain regions, which may be the substrate of the integrated circuit or a region suitably formed in the substrate, are connected directly to the source regions of the respective transistors. The cells which define the layouts of the various modules therefore provide a single trace for producing both the source connections and the body connections of transistors of the same type.

Two major problems for the designers of complex integrated circuits, especially if the circuits contain digital parts and analog parts, such as the circuits used in many telecommunication devices, are those of noise and current absorption when the circuit is in stand-by mode. The noise is due principally to the switching of the transistors of the digital parts, which induces, in the common substrate, currents which interfere with the functioning of the analog parts which produce small signals. Current absorption is due principally to the so-called subthreshold conduction of the MOS transistors of the digital parts.

In order to reduce the noise, the aim is to design the layout of the integrated circuit in such a manner that the digital parts and the analog parts are as far away from each other as possible or are electrically insulated from one another and in such a manner that the electroconductive strips which connect the source regions to one another and to the substrate have as low a resistance as possible in order to avoid appreciable voltage drops therein with consequent biasing at various voltages of various points of the substrate. These measures are, however, in contrast with the ever growing requirement to reduce the dimensions of integrated circuits or to provide more complex circuits. In addition, the greater the degree of integration, the more it is necessary to rely on automatic design, avoiding demanding interventions by the designer intended to modify the layout resulting from automatic design.

The problem of current absorption when the circuit is in stand-by mode is also all the more serious the greater the degree of integration, or, to be more precise, the greater the number of transistors of the digital parts of the integrated circuit. The problem is even more serious when the integrated circuit is designed to be supplied at low voltage such as, for example, in portable telephone applications in which the stand-by mode is prolonged and the power supply of the apparatus is provided by a small battery. In this case the transistors are produced with low threshold voltages and the difference between the conduction potential and the non-conduction potential is correspondingly small. Thus, the current due to the subthreshold conduction is relatively high. By way of example, an n-channel MOS type transistor may have a subthreshold conduction of the order of 1 nA per μm of width, and therefore a circuit containing some hundreds of thousands of transistors can absorb in stand-by mode hundreds of μA, which is a very high value for a circuit supplied by a low-capacity battery.

SUMMARY OF THE INVENTION

An object of the present invention is to provide a library of cells which lends itself to the design of integrated circuits in which the problems described above are avoided, or at least mitigated.

This and other objects in accordance with the present invention are provided by a library of standard cells for the design of integrated circuits comprising MOS transistors and connecting strips of electrically conductive material, wherein the layout in each cell comprises at least two traces which extend at a substantially right-angle direction to an identical side of the cells for defining respective connecting strips for supply connections to a respective circuit module. At least one connecting strip is preferably in contact with a source region of at least one MOS transistor of a respective circuit module. Moreover, each cell of a first group of cells may have a layout comprising at least one additional trace extending in the substantially right-angle direction for defining an additional connecting strip in contact with a body region of the at least one MOS transistor of the circuit module.

The layout defined in each cell may be contained in a quadrangular area. The library of cells in accordance with the invention may be used to produce an integrated circuit, particularly of a type suitable for telecommunications applications.

The additional trace preferably defines the additional strip in a position adjacent to one of the at least two strips for supply connection of the respective circuit module. In addition, each cell of a second group of cells preferably has a layout so that the at least one connecting strip for supply is also in contact with a body region of the at least one MOS transistor. The layout of each cell may be such that the additional strip and the adjacent strip for connection to the supply occupy an area which has an extent D in the direction of the first side, and the extent D is substantially equal to that of an area occupied by the connecting strip for connection to the supply and which is in contact both with a source region and with a body region of the at least one MOS transistor.

BRIEF DESCRIPTION OF THE DRAWINGS

The invention will become clearer from the following detailed description and with reference to the appended drawings, in which.

DETAILED DESCRIPTION OF PREFERRED EMBODIMENTS

Figure 1:
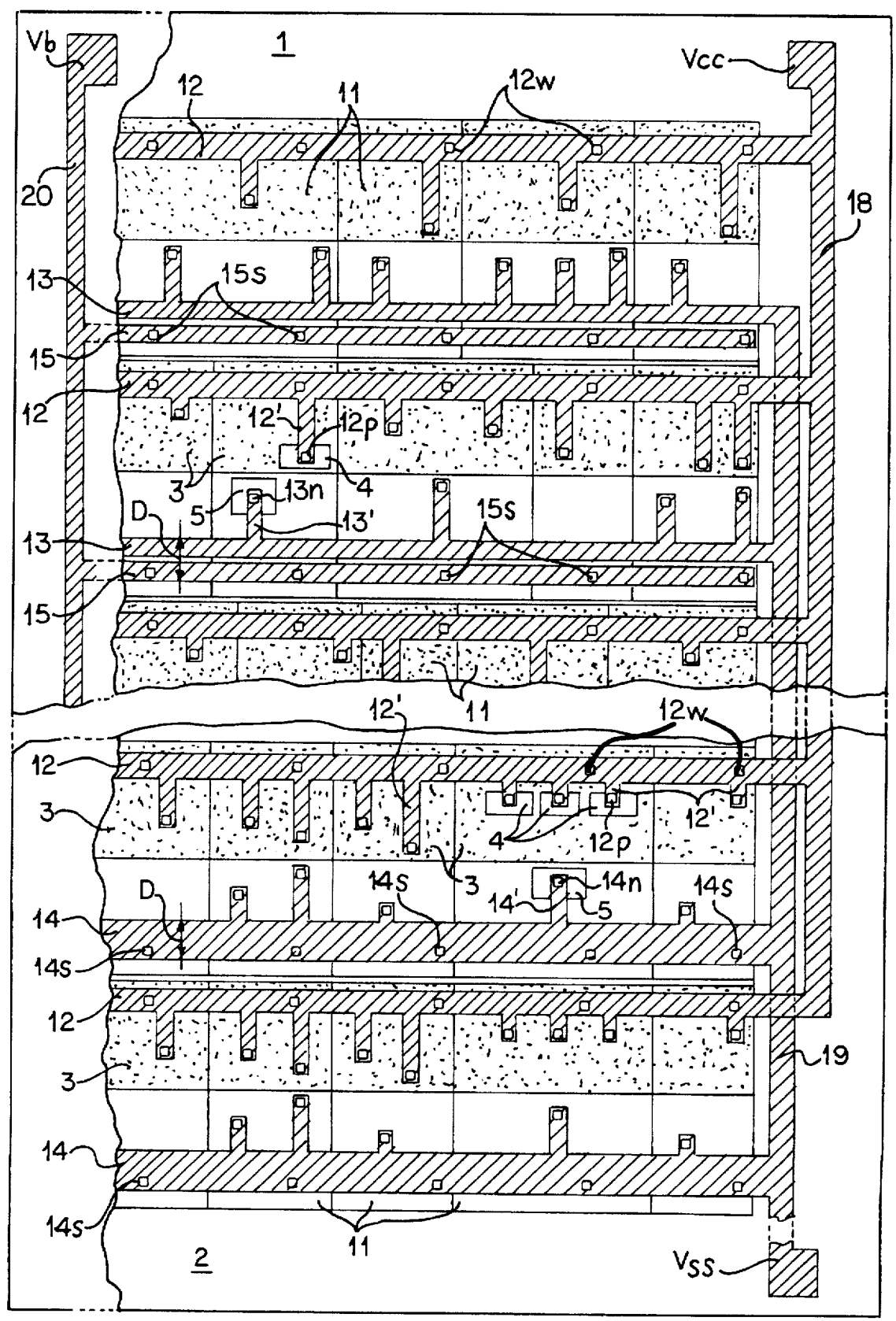
FIG. 1 shows diagrammatically and partially the layout of an integrated circuit produced using a cell library according to the invention.

FIG. 1 shows the partial layout of two portions, indicated 1 and 2, of an integrated circuit obtained using a cell library according to the invention. In a practical embodiment, the integrated circuit is produced using 0.7 μm CMOS technology on a monocrystalline silicon substrate, doped with p-type impurities, and, where the n-channel transistors are formed directly in the p-substrate and the p-channel transistors are formed in n-wells diffused into the substrate.

Figure 2A:
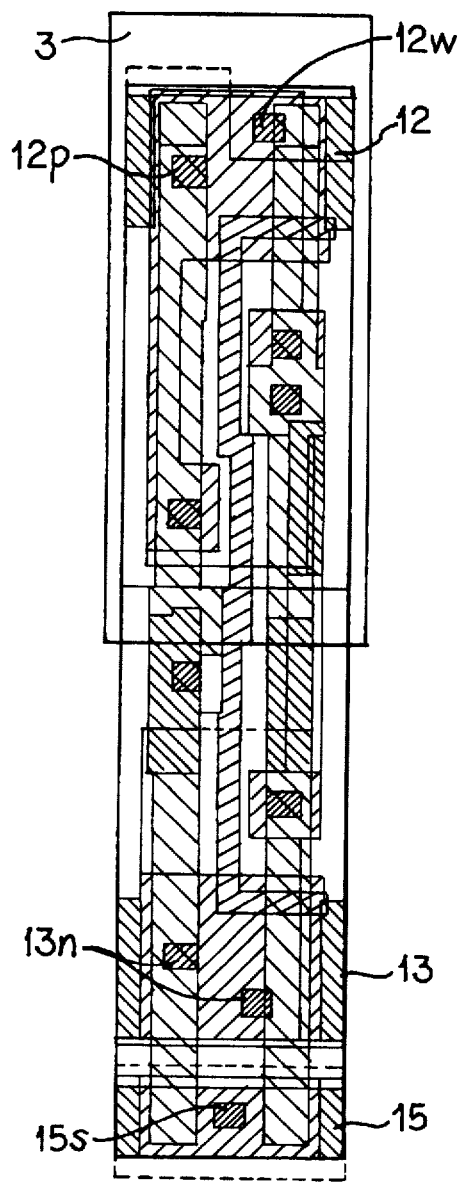
FIGS. 2A and 2B show the actual layouts of two standard cells of a cell library according to the invention.
Figure 2B:
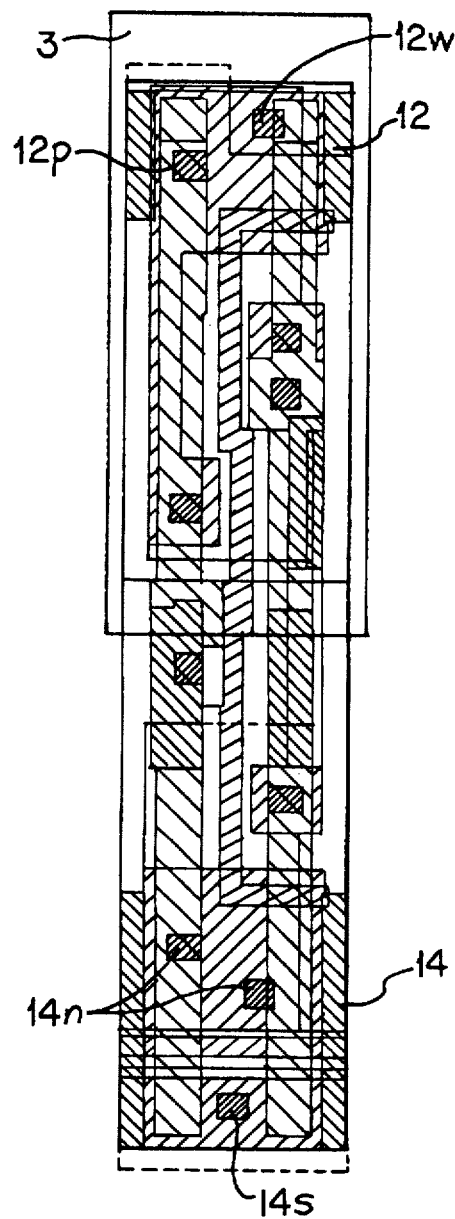

The representation in FIG. 1 has deliberately been simplified in relation to reality for the sake of clarity. Only some of the elements of the layout, that is to say, those necessary to understand the invention, are shown in the drawing. A more realistic representation, even though restricted to a single module, is, however, provided by FIGS. 2A and 2B. These Figures show the layout of a simple inverter having source and body connections of the n-channel transistor which are produced using two strips (FIG. 2A) or using a single strip (FIG. 2B). Only a few elements also represented in FIG. 1 are indicated here with a reference numeral identical to that used in FIG. 1; the other elements, which are not described because they are not necessary to explain the invention, are readily understandable by one of skill in the layout of CMOS integrated circuits.

The two portions 1 and 2 of the integrated circuit are formed by functional modules, represented by adjacent rectangles, indicated 11, which all have the same height, that is to say, the vertical side in the drawing, and generally different bases, that is to say, the horizontal sides in the drawing. The n-wells are shown by dotted areas indicated 3 and inside these are represented the p+ source regions, indicated 4, of some p-channel transistors. Also shown are the n+ source regions, indicated 5, of some n-channel transistors formed in the p-substrate. It will be noted that in order not to complicate the drawing unnecessarily, the regions 4 and 5 are shown only in one module of portion 1 and in one module of portion 2.

The modules 11 are traversed by metallic connecting strips which extend in the horizontal direction and are indicated 12, 13, 14 and 15 and have, with the exception of those indicated 15, vertical branches, indicated 12', 13' and 14' only in two modules, which extend inside the modules.

The strips, which are electrically insulated from the surface of the silicon chip are in electrical connection with some regions of the modules 11 by means of contact points. More particularly, in the example shown, the strips 12 and 13 of the portion 1 and the strips 12 and 14 of the portion 2 are to be connected to two supply terminals, Vcc and Vss, respectively, of the integrated circuit and are for that purpose connected to strips, 18 and 19, respectively, which terminate in areas indicated Vcc and Vss, respectively. The strips 15 are to be connected to a source of bias potential Vb and are connected to a strip 20 which terminates in an area indicated Vb. It will be noted that a pair of connecting strips 13 and 15 in a module 11 of the portion 1 occupy an area which has a vertical extent D equal to that of the area occupied by a single strip 14 of the portion 2.

The strips 13 and 14 for connection to the supply Vss are in ohmic contact with the n+ source regions 5 of some of the n-channel transistors of the pairs of CMOS transistors by way of respective contact points 13n and 14n provided at the ends of the branches 13' and 14', respectively. The strips 14 of the portion 2 are in ohmic contact also with the p-substrate by way of respective contact points 14s and corresponding p+ enriched surface regions (not shown). The strips 15 for connection to the bias potential source Vb are in ohmic contact only with the p-substrate, that is to say, with the body region of the n-channel transistors, by way of contact points 15s and corresponding p+ enriched surface regions (not shown). The strips 12 of both of the portions 1 and 2 are in ohmic contact both with the p+ source regions 4 of some of the p-channel transistors of the pairs of CMOS transistors, by way of respective contact points 12p provided at the ends of the branches 12', and with the n-wells 3 by way of respective contact points 12w and corresponding n+ enriched surface regions (not shown).

From a functional point of view, the possibility of biasing separately the source regions and the body regions (the p-substrate) of the n-channel transistors of the portion 1 by means of the connecting strips 13 and 15 avoids the disadvantages described above of a common biasing. If the portion 1 forms part of an analog circuit assembly of the integrated circuit, any noise present in the supply connections of a digital part of the same integrated circuit owing to the switching of its components is not induced in the substrate, and therefore the risk of interference with the high impedance nodes of the analog circuit is largely avoided. In addition, if it is desired to reduce the current absorption of the digital parts of the integrated circuit to the maximum extent, it is possible to bias the substrate with a potential Vb that is lower than the Vss potential of the source regions of the n-channel transistors when the circuit is in stand-by mode, in order thus to reduce the subthreshold conduction of the transistors.

It will be appreciated that, apart from the two applications discussed above, it is possible to have other applications in which the separate bias of source and body can advantageously be used. On the other hand, when separate biasing is not necessary, the strips 13 and 15 for the separate connection of the sources and the bodies of the n-channel transistors may be replaced by a single connecting strip such as that indicated 14 in portion 2 of FIG. 1.

As will be appreciated, the cell library according to the above-described embodiment of the invention permits the design of integrated circuits containing both forms of the connecting strips because it provides both groups of cells that define circuit modules having a single connecting strip for the source and body of the n-channel transistors and groups of cells that define circuit modules having different connecting strips for the source and body of the transistors. The difference between cells that define identical functional modules for the two groups is restricted to the different configuration of the source and body connections, which in practice constitutes a simple variant of the program which defines the layout of the cells of the cell library in geometric terms.

It will be noted that the strips 13 and 15 for the connection of the source and body of the n-channel transistors can be placed at any distance from one another and from the bases of the modules, in line with the functional requirements of the modules defined by the cells. The strips 13 and 15 can be connected to one another outside the modules, for example by using the vertical trace indicated 19 in the drawing, in order to enable the source and body regions to be connected at the same potential. However, the arrangement of the strips 13 and 15 in adjacent positions to one another in each module, as in the example shown, is particularly suitable because with a simple modification to the program for generating the connecting traces, a single strip is obtained such as that indicated 14 in FIG. 1, in the same position as the two strips and of greater width. This is advantageous both because it permits, for each module having a given function, a single cell which represents the layout thereof, except for the configuration of the connecting traces of the source and body regions, and because the greater width of the common connecting strip of the source and body results in a lower resistance and therefore a lesser sensitivity to the noise in the substrate (drop in potential along the strip).

It will also be appreciated that the layout of the integrated circuit can be produced by using only cells that define functional modules having different connecting strips for the sources and bodies of the transistors, such as those of portion 1 in the example of FIG. 1. Once automatic design has been completed, the designer, after having examined the resulting layout and optionally after having checked the functionality of the circuit defined by the layout by means of known systems of computer simulation, can decide whether to modify the layout of some of the cells by connecting to one another the two traces intended to produce two different connecting strips when the separate biasing of the source and body is not necessary. This can be readily effected by means of the automatic design system by substituting the cells to be modified by cells of the group in which the two traces are joined, or, if the cells of this last type are not available in the cell library, by correcting the layout manually.

It will be appreciated from the above that the cell library according to the invention is an extremely versatile design instrument.

Although an embodiment has been illustrated and described in which in one circuit portion the source and body connections are produced with different strips only for n-channel transistors of pairs of CMOS transistors, the same can be effected, as an alternative or in combination, for the source and body connections of p-channel transistors of the pairs wherever this is advantageous for any reason, for example, in order to avoid or mitigate problems similar to those described above in respect of n-channel transistors. In this case, the cell library according to the invention will comprise cells that define layouts correspondingly modified to obtain modules according to this variant.

Although a single application of the cell library according to the invention has been illustrated and described, it will be appreciated that numerous variations and modifications are possible within the scope of the same inventive concept. For example, a library according to the invention lends itself to being used in the design of integrated circuits that also comprise a single type of MOS transistor, that is to say, only n-channel transistors or only p-channel transistors, or in the design of integrated circuits that comprise circuit portions containing pairs of CMOS transistors and circuit portions containing only n-channel MOS transistors or only p-channel MOS transistors. In addition, although in the example represented and described there are two connecting strips for supply, it is also possible, with a cell library according to the invention, to define circuit modules having more than two supply strips.

We claim:

1. A library of standard cells for designing integrated circuits comprising MOS transistors and connecting strips of electrically conductive material, the library comprising;

a plurality of cells, each cell having a layout of a respective circuit module and each having a first side substantially the same for all of the cells;

said layout in each cell comprising at least two traces which extend at a substantially right-angle direction to the first side for defining respective connecting strips for supply connection of a respective circuit module, at least one connecting strip being in contact with a source region of at least one MOS transistor of a respective circuit module; and each cell of at least one first group of cells of said plurality of cells having a layout comprising at least one additional trace extending in the substantially right-angle direction for defining a separate additional biasing connecting strip in contact with a body region of the at least one MOS transistor of the respective circuit module having the source region in contact with the at least one connecting strip for connection to the supply.

2. A cell library according to claim 1, wherein said additional trace defines the additional strip in a position adjacent to one of the at least two connecting strips for supply connection of the respective circuit module.

3. A cell library according to claim 1, wherein each cell of a second group of cells of said plurality of cells has a layout so that the at least one connecting strip for supply is also in contact with a body region of the at least one MOS transistor.

4. A cell library according to claims 2, wherein the layout of each cell is such that the additional strip and the adjacent strip for connection to the supply occupy an area which has an extent D in the direction of the first side, the extent D being substantially equal to that of an area occupied by the connecting strip for connection to the supply which is in contact both with a source region and with a body region of the at least one MOS transistor.

5. A cell library according to claim 1, wherein the layout defined in each cell is contained in a quadrangular area.

6. A library of standard cells for designing integrated circuits comprising MOS transistors and connecting strips of electrically conductive material, the library comprising:

a plurality of cells, each cell having a layout of a respective circuit module and having a first side substantially the same for all of the cells, the layout of each cell being contained within a quadrangular area;

said layout in each cell comprising at least two traces which extend at a substantially right-angle direction to the first side for defining respective connecting strips for supply connection of a respective circuit module, at least one connecting strip being in contact with a source region of at least one MOS transistor of a respective circuit module; and each cell of a first group of cells of said plurality of cells having a layout comprising at least one additional trace extending in the substantially right-angle direction for defining a separate additional biasing connecting strip in contact with a body region of the at least one MOS transistor of the respective circuit module having the source region in contact with the at least one connecting strip for connection to the supply, said additional trace defining the additional strip in a position adjacent to one of the at least two strips for supply connection of the respective circuit module.

7. A cell library according to claim 6, wherein each cell of a second group of cells of said plurality of cells has a layout so that the at least one connecting strip for supply is also in contact with a body region of the at least one MOS-transistor.

8. A cell library according to claim 6, wherein the layout of each cell is such that the additional strip and the adjacent strip for connection to the supply occupy an area which has an extent D in the direction of the first side, the extent D being substantially equal to that of an area occupied by the connecting strip for connection to the supply which is in contact both with a source region and with a body region of the at least one MOS transistor.

9. An integrated circuit comprising:

a plurality of circuit modules, each having MOS transistors and connecting strips of an electrically conductive material, each circuit module being within a substantially quadrangular area and having a first side which is substantially the same for all the circuit modules;

said connecting strips extending over the substantially quadrangular area of each module in a substantially right-angle direction to the first side to form at least two connecting strips of the circuit module for the supply thereof, at least one of said at least two connecting strips for connection to the supply being in contact with a source region of at least one MOS transistor; and each circuit module of at least one first group of circuit modules comprising at least one separate additional biasing connecting strip which is in contact with a body region of the said at least one MOS transistor.

10. An integrated circuit according to claim 9, wherein the additional strip is positioned adjacent to one of the strips for connection to the supply.

11. An integrated circuit according to claim 9, further comprising a second group of modules in which the strip for connection to the supply which is in contact with a source region of at least one MOS type transistor is in contact also with a body region of the same transistor.

12. An integrated circuit according to claims 9, wherein the additional strip and the adjacent strip for connection to the supply occupy an area which has an extent D, in the direction of the side which is the same for all the circuit modules, the extent D being substantially equal to that of an area occupied by the connecting strip for connection to the supply which is in contact both with a source region and with a body region of the at least one MOS transistor.

13. An integrated circuit according to claim 9, wherein said plurality of modules comprise means for processing telecommunications signals.

* * * * *